(12) United States Patent
Na et al.

(10) Patent No.: US 9,147,741 B2
(45) Date of Patent: Sep. 29, 2015

(54) THIN FILM TRANSISTOR DISPLAY PANEL AND METHOD OF MANUFACTURING THE SAME

(71) Applicant: SAMSUNG DISPLAY CO., LTD., Gyeonggi-do (KR)

(72) Inventors: Hyun Jae Na, Dobong-gu (KR); Yoon Ho Khang, Yongin-si (KR); Sang Ho Park, Suwon-si (KR); Dong Hwan Shim, Yongin-si (KR); Se Hwan Yu, Dongjak-gu (KR); Yong Su Lee, Gyeonggi-do (KR); Myoung Geun Cha, Seodaemun-gu (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 13/892,574

(22) Filed: May 13, 2013

(65) Prior Publication Data

US 2014/0138772 A1    May 22, 2014

(30) Foreign Application Priority Data

Nov. 6, 2012  (KR) .................. 10-2012-0124717

(51) Int. Cl.
*H01L 21/84*   (2006.01)
*H01L 21/20*   (2006.01)
(Continued)

(52) U.S. Cl.
CPC ...... *H01L 29/4908* (2013.01); *H01L 29/78603* (2013.01); *H01L 29/78633* (2013.01)

(58) Field of Classification Search
CPC ............ H01L 27/1237; H01L 27/1214; H01L 27/1288; H01L 27/1251; H01L 27/1259; H01L 27/3248; H01L 27/12; H01L 21/02414; H01L 21/02483; H01L 21/02565; H01L 21/84; H01L 21/16; H01L 21/336; H01L 29/7869; H01L 29/786; H01L 29/66765; H01L 29/78669; H01L 29/78693; H01L 29/66742; H01L 29/66; H01L 29/8603; H01L 2924/13069

USPC ......... 438/151, 149, 142, 301, 290, 294, 296, 438/299, 303, 305, 306, 479, 738, 740, 924, 438/970, 40, 43, 634, 708, 709, 104, 608, 438/262, 153, 154, 158, 164, 722; 257/347, 257/43, 59, 57, 104, E21.427, E21.476, 257/E21.431, E29.296, E21.619, E21.628, 257/E29.267, E29.268, E21.412, E21.409, 257/E27.112, E29.068, E29.291, E29.273, 257/E29.151

See application file for complete search history.

(56) References Cited

U.S. PATENT DOCUMENTS 5,605,847 A * 2/1997  Zhang .......................... 438/164
6,608,658 B1  8/2003  Tsujimura et al.
(Continued)

FOREIGN PATENT DOCUMENTS

JP    2005-033009    2/2005
JP    2009-158840    7/2009
(Continued)

OTHER PUBLICATIONS

U.S. Appl. No. 13/755,730.

*Primary Examiner* — Chuong A Luu
*Assistant Examiner* — Moazzam Hossain
(74) *Attorney, Agent, or Firm* — F. Chau & Assoicates, LLC

(57) ABSTRACT

A thin film transistor display panel according to an exemplary embodiment of the present invention includes a substrate, a first insulating layer formed on the substrate, a semiconductor layer formed on the first insulating layer, a second insulating layer formed on the semiconductor layer, and a gate electrode formed on the second insulating layer, in which the first insulating layer includes a light blocking material, and a thickness of the first insulating layer is greater than or equal to a thickness of the second insulating layer.

11 Claims, 6 Drawing Sheets

(51) Int. Cl.
*H01L 29/49* (2006.01)
*H01L 29/786* (2006.01)

(56) References Cited

U.S. PATENT DOCUMENTS

| | | | |
|---|---|---|---|
| 6,734,052 | B2 | 5/2004 | Tateishi |
| 7,932,137 | B2 | 4/2011 | Tanabe |
| 2009/0014721 | A1* | 1/2009 | Tanabe ............................ 257/59 |
| 2009/0047750 | A1* | 2/2009 | Chiu et al. ...................... 438/30 |
| 2010/0210057 | A1* | 8/2010 | Miyairi et al. .................. 438/34 |
| 2011/0299005 | A1 | 12/2011 | Takeguchi et al. |
| 2012/0146039 | A1 | 6/2012 | Gosain et al. |

FOREIGN PATENT DOCUMENTS

| | | |
|---|---|---|
| JP | 2009200152 | 9/2009 |
| JP | 2010008635 | 1/2010 |
| JP | 2011-186108 | 9/2011 |
| JP | 2011-187931 | 9/2011 |
| JP | 2011-238835 | 11/2011 |
| JP | 2011-253921 | 12/2011 |
| KR | 10-2011-0082258 | 7/2011 |
| KR | 10-2011-0086937 | 8/2011 |
| KR | 10-2012-0043336 | 5/2012 |

* cited by examiner

THIN FILM TRANSISTOR DISPLAY PANEL AND METHOD OF MANUFACTURING THE SAME

CROSS-REFERENCE TO RELATED APPLICATION

This application claims priority under 35 U.S.C. §119 to Korean Patent Application No. 10-2012-0124717 filed in the Korean Intellectual Property Office on Nov. 6, 2012, the disclosure of which is incorporated by reference herein in its entirety.

TECHNICAL FIELD

Embodiments of the present invention relate to a thin film transistor display panel and a method of manufacturing the same.

DISCUSSION OF THE RELATED ART

A thin film transistor (TFT) is often used as a switching element for driving each pixel in a flat display panel such as a liquid crystal display or an organic light emitting diode display. A thin film transistor display panel includes thin film transistors, pixel electrodes connected to the thin film transistors, gate lines transmitting gate signals to the thin film transistors, and data lines for transmitting data signals to pixels.

A thin film transistor may include a semiconductor layer, a gate electrode connected to a gate line and formed on the semiconductor layer, a source electrode connected to a data line, and a drain electrode connected to a pixel electrode, and transmits a data signal through the data line to the pixel electrode according to a gate signal transmitted through the gate line.

A structure in which a gate electrode is positioned on a semiconductor layer is referred to as an upper gate (top-gate) structure. In the upper gate structure, the semiconductor layer may be exposed to light emitted from a backlight assembly positioned at a lower side of the thin film transistor display panel, and a light leakage current may be thus generated in the semiconductor layer.

SUMMARY

An exemplary embodiment of the present invention provides a thin transistor display panel, including a substrate, a first insulating layer formed on the substrate, a semiconductor layer formed on the first insulating layer, a second insulating layer formed on the semiconductor layer, and a gate electrode formed on the second insulating layer. The first insulating layer includes a light blocking material. A thickness of the first insulating layer is greater than or equal to a thickness of the second insulating layer.

The first insulating layer may include a lower buffer layer, a first light blocking member formed on the lower buffer layer, and an upper buffer layer formed on the first light blocking member.

A thickness of the upper buffer layer and the first light blocking member may be smaller than or equal to the thickness of the second insulating layer.

The upper buffer layer and the first light blocking member may be formed in substantially the same pattern as the semiconductor layer, and the second insulating layer may be formed in substantially the same pattern as the gate electrode.

The first insulating layer may be made of a material having a different etching rate from an etching rate of the semiconductor layer.

The lower buffer layer and the upper buffer layer may be made of silicon oxide or silicon nitride, and the first light blocking member may be made of silicon germanium or titanium oxide.

The second insulating layer may include a lower gate insulation film, a second light blocking member formed on the lower gate insulation film, and an upper gate insulation film formed on the second light blocking member.

The lower gate insulation film and the upper gate insulation film may be made of silicon oxide or silicon nitride, and the second light blocking member may be made of silicon germanium or titanium oxide.

The second insulating layer may be formed of a single layer.

The thin film transistor display panel according to an exemplary embodiment of the present invention may further include a passivation film formed on the semiconductor layer and the gate electrode, a contact hole formed through the passivation film, and a source electrode and a drain electrode formed on the passivation film connected to the semiconductor layer through the contact hole. At least a part of the semiconductor layer is exposed through the contact hole.

An exemplary embodiment of the present invention provides a method of manufacturing a thin film transistor display panel, including depositing a first insulation material including a light blocking material on a substrate, depositing a semiconductor material on the first insulation material, depositing a second insulation material on the semiconductor material, forming a first photosensitive film pattern on the second insulation material, patterning the second insulation material using the first photosensitive film pattern, forming a semiconductor layer by patterning the semiconductor material using the first photosensitive film pattern, removing the first photosensitive film pattern, depositing a gate metal material on the second insulation material, forming a second photosensitive film pattern on the gate metal material, forming a gate electrode by patterning the gate metal material using the second photosensitive film pattern, and forming a first insulating layer and a second insulating layer by substantially simultaneously patterning the first insulation material and the second insulation material using the second photosensitive film pattern.

The first insulating layer may include a lower buffer layer, a first light blocking member formed on the lower buffer layer, and an upper buffer layer formed on the first light blocking member.

The first insulating layer may be formed by removing the first insulation material that is not covered by the semiconductor layer, and the second insulating layer may be formed by removing the second insulation material that is not covered by the second photosensitive film pattern.

At least a part of the lower buffer layer covered by the semiconductor layer may remain.

The first insulation material may be made of a material having a different etching rate from an etching rate of the semiconductor layer.

The lower buffer layer and the upper buffer layer may be made of silicon oxide or silicon nitride, and the first light blocking member may be made of silicon germanium or titanium oxide.

The second insulating layer may include a lower gate insulation film, a second light blocking member formed on the lower gate insulation film, and an upper gate insulation film formed on the second light blocking member.

The lower gate insulation film and the upper gate insulation film may be made of silicon oxide or silicon nitride, and the second light blocking member may be made of silicon germanium or titanium oxide.

The second insulating layer may be formed of a single layer.

The method of manufacturing a thin film transistor display panel according to an exemplary embodiment of the present invention may further include removing the second photosensitive film pattern, forming a passivation film on the semiconductor layer and the gate electrode, forming a contact hole by patterning the passivation film, and forming a source electrode and a drain electrode, which are connected to the semiconductor layer through the contact hole, on the passivation film. At least a part of the semiconductor layer is exposed through the contact hole.

According to an embodiment of the present invention, a method of manufacturing a thin film transistor includes depositing a first insulating material on a substrate, depositing a semiconductor material on the first insulating material, depositing a second insulating material on the semiconductor material, and forming a first insulating layer and a second insulating layer by substantially simultaneously patterning the first and second insulating materials, in which the first insulating layer includes a light blocking member.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EXEMPLARY EMBODIMENTS

Figure 1:
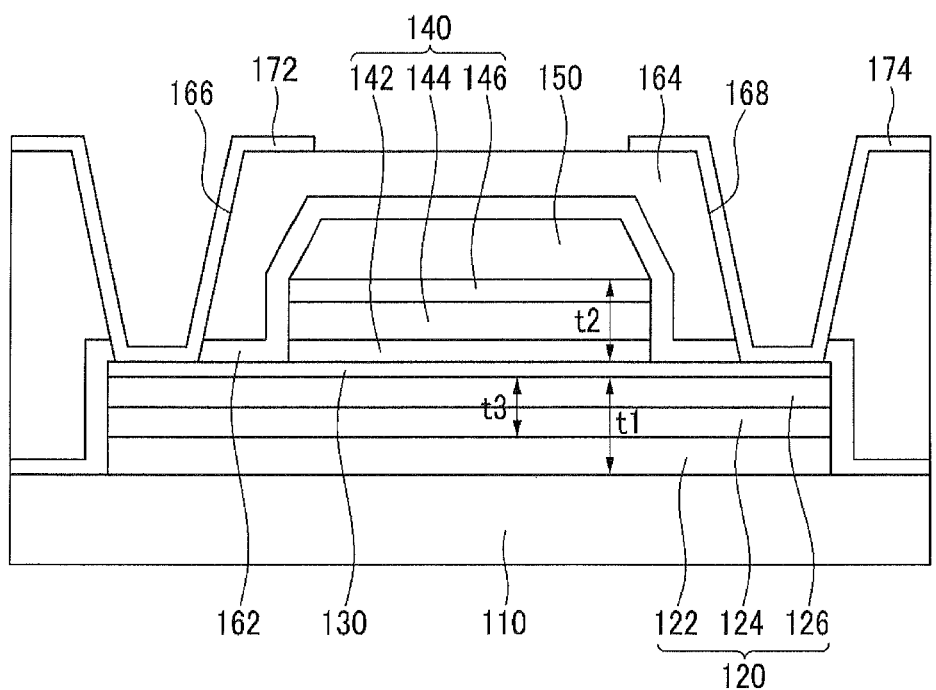
FIG. 1 is a cross-sectional view illustrating a thin film transistor display panel according to an exemplary embodiment of the present invention.

Exemplary embodiments of the present invention will be described in more detail hereinafter with reference to the accompanying drawings. As those skilled in the art would realize, the described embodiments may be modified in various different ways.

Like reference numerals may designate like or similar elements throughout the specification and the drawings. It will be understood that when an element is referred to as being "on," "connected to," or "coupled to" another element, it can be directly on, connected to or coupled to the other element or intervening elements may be present.

As used herein, the singular forms "a," "an," and "the" are intended to include the plural fauns as well, unless the context clearly indicates otherwise.

FIG. 1 is a cross-sectional view illustrating a thin film transistor display panel according to an exemplary embodiment of the present invention.

A thin film transistor display panel according to an exemplary embodiment of the present invention includes a substrate 110 made of glass, plastic or the like, a first insulating layer 120 formed on the substrate 110, a semiconductor layer 130 formed on the first insulating layer 120, a second insulating layer 140 formed on the semiconductor layer 130, and a gate electrode 150 formed on the second insulating layer 140.

The first insulating layer 120 includes a lower buffer layer 122 formed on the substrate 110, a first light blocking member 124 formed on the lower buffer layer 122, and an upper buffer layer 126 formed on the first light blocking member 124.

The first insulating layer 120 includes a light blocking material, and for example, the first light blocking member 124 is made of a light blocking material. A backlight assembly is formed below the substrate 110 and supplies light to the substrate 110. The first light blocking member 124 blocks light supplied from the backlight assembly from entering the semiconductor layer 130. Thus, the light blocking material may prevent a light leakage current from being generated in the semiconductor layer 130. For example, the first light blocking member 124 is made of a material that is able to absorb light supplied from the backlight assembly. A material of the first light blocking member 124 is determined in consideration of a wavelength range of light supplied from the backlight assembly. For example, the first light blocking member 124 may be made of silicon germanium (SiGe) or titanium oxide (TiOx).

The lower buffer layer 122 and the upper buffer layer 126 are made of an insulation material. For example, the lower buffer layer 122 and the upper buffer layer 126 may be made of an inorganic insulation material, such as silicone oxide (SiOx) or silicon nitride (SiNx). The lower buffer layer 122 may be omitted, and thus the first insulating layer 120 includes only the first light blocking member 124 and the upper buffer layer 126.

The semiconductor layer 130 may be made of a metal oxide. For example, the semiconductor layer 130 is made of GIZO (Gallium Indium Zinc Oxide), ZTO (Zinc Tin Oxide), IZO (Indium Tin Oxide), or the like. Further, a semiconductor layer 130 may be made of amorphous silicon, polycrystalline silicon, poly silicon, or the like.

The semiconductor layer 130 overlaps at least a part of the second insulating layer 140. A central portion of the semiconductor layer 130 may overlap the second insulating layer 140. Two end portions of the semiconductor layer 130 that do not overlap the second insulating layer 140 are rendered conductive. The semiconductor layer 130 overlapping the second insulating layer 140 forms a channel.

The semiconductor layer 130 is formed in substantially the same pattern as at least a part of the first insulating layer 120. The semiconductor layer 130 may be formed in substantially the same pattern as the upper buffer layer 126 and the first light blocking member 124 of the first insulating layer 120. The first insulating layer 120 is made of a material having a different etching rate from an etching rate of the semiconductor layer 130. Therefore, the semiconductor layer 130 functions as a mask in a process of etching the first insulating layer 120, and thus the first insulating layer 120 and the semiconductor layer 130 have substantially the same pattern.

In the process of etching the first insulating layer 120, the upper buffer layer 126 of the first insulating layer 120 is etched, and then the first light blocking member 124 and the lower buffer layer 122 are sequentially etched. Therefore, while the upper buffer layer 126 and the first light blocking member 124 are etched, a part of the lower buffer layer 122 is not necessarily etched. In this case, the upper buffer layer 126 and the first light blocking member 124 have substantially the same pattern as the semiconductor layer 130, and the lower buffer layer 122 has a different pattern from the semiconductor layer 130.

The second insulating layer 140 includes a lower gate insulation film 142 formed on the semiconductor layer 130, a second light blocking member 144 formed on the lower gate insulation film 142, and an upper gate insulation film 146 formed on the second light blocking member 144.

The second insulating layer 140 includes a light blocking material. For example, the second light blocking member 144 is made of a light blocking material. The first light blocking member 124 may prevent light supplied from the backlight assembly from entering a lower portion of the semiconductor layer 130. However, light having entered a portion where the first light blocking member 124 is not formed may be reflected by a layer made of a reflective metal material and may enter an upper portion of the semiconductor layer 130. The second insulating layer 140 including a light blocking material is formed on the semiconductor layer 130 of the thin film transistor display panel according to an exemplary embodiment of the present invention, and thus, the second insulating layer 140 may block light from entering the upper portion of the semiconductor layer 130. For example, the second light blocking member 144 may prevent light supplied from the backlight assembly from entering the upper portion of the semiconductor layer 130. Thus, the light blocking material may prevent a light leakage current from being generated in the semiconductor layer 130.

The second light blocking member 144 blocks light supplied from the backlight assembly from entering the semiconductor layer 130. The second light blocking member 144 is made of a material that is able to absorb light supplied from the backlight assembly. A material of the second light blocking member 144 is determined in consideration of a wavelength range of light supplied from the backlight assembly. For example, the second light blocking member 144 may be made of silicon germanium (SiGe) or titanium oxide (TiOx).

The lower gate insulation film 142 and the upper gate insulation film 146 are made of an insulation material. For example, the lower gate insulation film 142 and the upper gate insulation film 146 may be made of an inorganic insulation material, such as silicon oxide (SiOx) or silicon nitride (SiNx).

The gate electrode 150 is made of a metal material and is positioned on the upper gate insulation film 146. The gate electrode 150 at least partially overlaps the semiconductor layer 130. For example, the gate electrode 150 overlaps the center portion of the semiconductor layer 130.

The gate electrode 150 and the second insulating layer 140 may be patterned by using the same mask. Therefore, the gate electrode 150 is formed in substantially the same pattern as the second insulating layer 140.

In the process of etching the second insulating layer 140, the first insulating layer 120 may also be etched. To substantially simultaneously form the first insulating layer 120 and the second insulating layer 140, a thickness t1 of the first insulating layer 120 and a thickness t2 of the second insulating layer 140 may be substantially equal to each other. The lower buffer layer 122 of the first insulating layer 120 may remain on the substrate 110 without being patterned, and therefore, the thickness t1 of the first insulating layer 120 may be greater than or equal to the thickness t2 of the second insulating layer 140. When the first light blocking member 124 of the first insulating layer 120 is not patterned and remains in a pixel area, which displays an image, the first light blocking member 124 may influence the luminance of the display panel. Therefore, a thickness t3 of the upper buffer layer 126 and the first light blocking member 124 may be smaller than or equal to the thickness t2 of the second insulating layer 140.

Passivation films 162 and 164 may be further formed on the semiconductor layer 130 and the gate electrode 150. The passivation films 162 and 164 may include a lower passivation film 162 formed to cover the semiconductor layer 130 and the gate electrode 150, and an upper passivation film 164 formed on the lower passivation film 162. The lower passivation film 162 may be made of an inorganic insulation material, and the upper passivation film 164 may be made of an organic insulation material. Although in FIG. 1, the passivation films 162 and 164 are formed of double layers, the embodiments of the present invention are not limited thereto, and the passivation films 162 and 164 may be formed of a single layer or multiple layers including three or more layers.

The passivation films 162 and 164 may include contact holes 166 and 168, and at least a part of the semiconductor layer 130 is exposed.

A source electrode 172 and a drain electrode 174, which are connected to the semiconductor layer 130 through the contact holes 166 and 168, may be formed on the passivation films 162 and 164. The source electrode 172 and the drain electrode 174 may be made of a transparent metal material, for example, such as ITO (Indium Tin Oxide) or IZO (Indium Zinc Oxide). Alternatively, the source electrode 172 may be made of a low resistance metal material. A connection electrode made of a transparent metal material may connect the source electrode 172 with the semiconductor layer 130.

The semiconductor layer 130, the gate electrode 150, the source electrode 172, and the drain electrode 174 form a single thin film transistor.

A gate line and a data line are connected to the gate electrode 150 and the source electrode 172, respectively. The gate electrode 150 receives a gate signal through the gate line, and the source electrode 172 receives a data signal through the data line. A pixel electrode is connected to the drain electrode 174. A predetermined voltage is charged to the pixel electrode when the thin film transistor is in an ON state.

FIGS. 2 to 5 are cross-sectional views illustrating a method of manufacturing a thin film transistor display panel according to an exemplary embodiment of the present invention.

Figure 2:
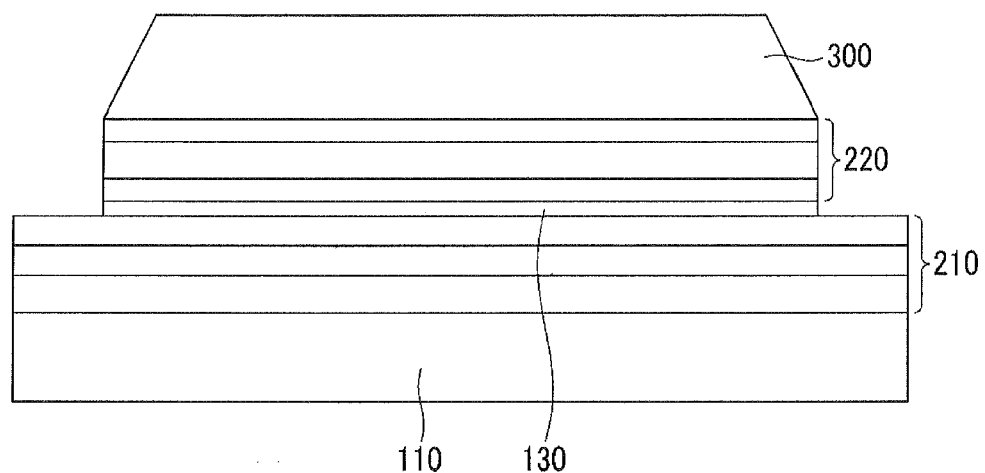
FIGS. 2 to 5 are process cross-sectional views illustrating a method of manufacturing a thin film transistor display panel according to an exemplary embodiment of the present invention.

As illustrated in FIG. 2, the first insulation layer 210 is deposited on the substrate 110 made of glass, plastic, or the like.

The first insulation material 210 may include a plurality of materials that are sequentially deposited on the substrate 110. The first insulation material 210 includes a light blocking material. For example, an inorganic insulation material, such as silicon oxide (SiOx) or silicon nitride (SiNx), is deposited on the substrate 110, and a light blocking material, such as silicon germanium (SiGe) or titanium oxide (TiOx), is then deposited on the inorganic insulation material. Next, an inorganic insulation material, such as silicon oxide (SiOx) or silicon nitride (SiNx), is deposited on the light blocking material.

A semiconductor material is deposited on the first insulation material 210.

The semiconductor material may be a metal oxide. For example, the semiconductor material may be GIZO (Gallium Indium Zinc Oxide), ZTO (Zinc Tin Oxide), IZO (Indium Tin Oxide), or the like. Further, the semiconductor material may be amorphous silicon, polycrystalline silicon, poly silicon, or the like.

A second insulation material 220 is deposited on the semiconductor material.

The second insulation material 220 may include a plurality of materials that are sequentially deposited on the semiconductor material. The second insulation material 220 includes a light blocking material. For example, an inorganic insulation material, such as silicon oxide (SiOx) or silicon nitride (SiNx), is deposited on the semiconductor material, and a light blocking material, such as silicon germanium (SiGe) or titanium oxide (TiOx), is then deposited on the inorganic insulation material. Next, an inorganic insulation material, such as silicon oxide (SiOx) or silicon nitride (SiNx), is deposited on the light blocking material.

A photosensitive material is applied on the second insulation material 220, and a first photosensitive film pattern 300 is formed by using a photo process. The second insulation material 220 is patterned by the first photosensitive film pattern 300. The semiconductor layer 130 is formed by patterning the semiconductor material by the first photosensitive film pattern 300.

In the process of patterning the second insulation material 220, the first insulation material 210 is covered by the semiconductor material, and thus not etched.

The first insulation material 210 has a different etching rate from an etching rate of the semiconductor layer 130. Therefore, in the process of patterning the semiconductor material to form the semiconductor layer 130, the first insulation material 210 is not etched and remains on the substrate 110.

Figure 3:
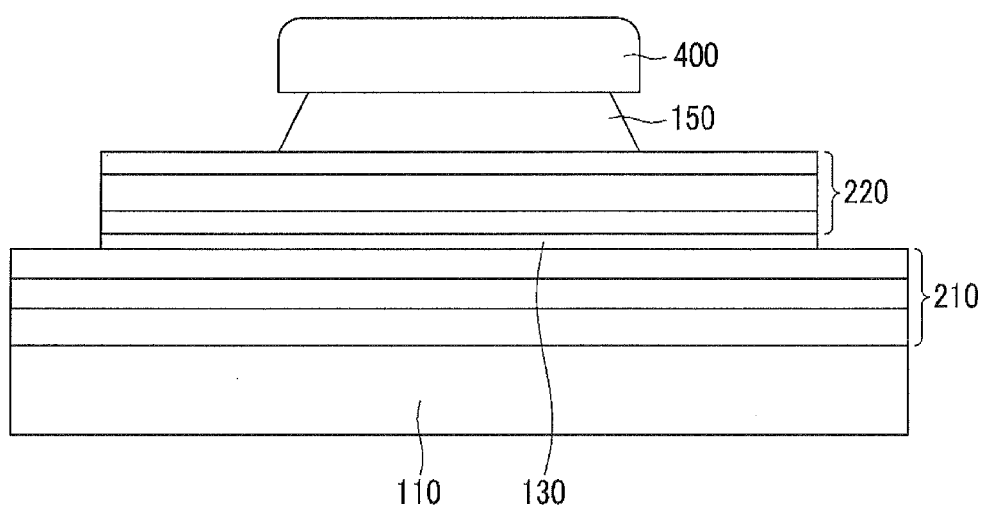

As illustrated in FIG. 3, the first photosensitive film pattern 300 is removed, and a gate metal material is deposited on the second insulation material 220.

A photosensitive material is applied on the gate metal material, and a second photosensitive film pattern 400 is formed by using a photo process. The gate electrode 150 is formed by patterning the gate metal material using the second photosensitive film pattern 400.

The first insulation material 210 and the second insulation material 220 are made of a material having a different etching rate from an etching rate of the gate electrode. Therefore, in the process of forming the gate electrode 150 by patterning the gate metal material, the first insulation material 210 and the second insulation material 220 are not etched and remain on the substrate 110.

Figure 4:
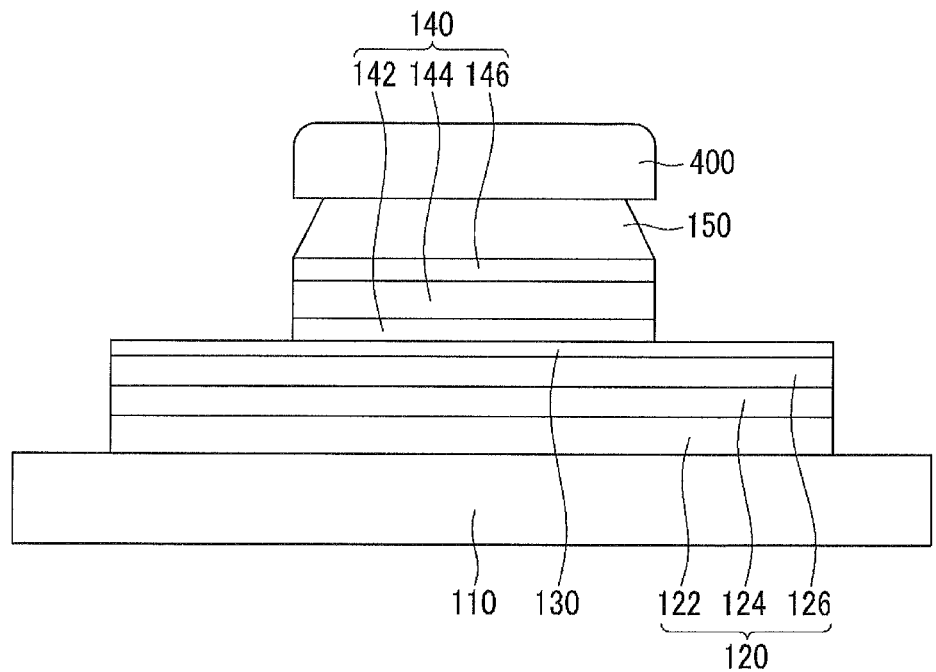

As illustrated in FIG. 4, the first insulating layer 120 and the second insulating layer 140 are formed by substantially simultaneously patterning the first insulation material 210 and the second insulation material 220, using the second photosensitive film pattern 400. The first insulation material 210 that is not covered by the semiconductor layer 130 is removed to thus form the first insulating layer 120, and the second insulation material 220 that is not covered by the second photosensitive film pattern 400 is removed to thus form the second insulating layer 140.

The semiconductor layer 130 is made of a material having an etching rate different from etching rates of the first insulation material 210 and the second insulation material 220, and thus is not patterned when substantially simultaneously patterning the first insulation material 210 and the second insulation material 220.

The first insulation material 210 is formed in a shape in which a plurality of materials are laminated, and thus the first insulating layer 120 is formed of multiple layers. The first insulating layer 120 includes a lower buffer layer 122 formed on the substrate 110, a first light blocking member 124 formed on the lower buffer layer 122, and an upper buffer layer 126 formed on the first light blocking member 124.

The first light blocking member 124 may be made of a light blocking material, such as silicon germanium (SiGe) or titanium oxide (TiOx).

The lower buffer layer 122 and the upper buffer layer 126 may be made of an inorganic insulation material, such as silicon oxide (SiOx) or silicon nitride (SiNx). The lower buffer layer 122 and the upper buffer layer 126 may be omitted, and thus the first insulating layer 120 may include only the first light blocking member 124. For example, unlike the first insulation material 210 shown in FIG. 2, the first insulation material 210 may be made of a single material.

The first insulating layer 120 is formed by removing the first insulation material 210 that is not covered by the semiconductor layer 130. Accordingly, parts of the lower buffer layer 122, the first light blocking member 124, and the upper buffer layer 126, which are covered by the semiconductor layer 130, remain as illustrated in FIG. 4.

However, the embodiments of the present invention are not limited thereto, and parts of the upper buffer layer 126 and the first light blocking member 124, which are not covered by the semiconductor layer 130, are removed, and at least a part of the lower buffer layer 122 that is not covered by the semiconductor layer 130 may remain. For example, the lower buffer 122 layer may be formed to have a different pattern from patterns of the semiconductor layer 130, the upper buffer layer 126 and the first light blocking member 124. In the process of patterning the first insulation material 210, the first insulation material 210 includes a plurality of laminated materials, in which an upper layer is etched earlier, and a lower layer is etched later. Therefore, the lower buffer layer 122 may remain at a portion where the upper buffer layer 126 and the first light blocking member 124 do not remain after etching.

The second insulation material 220 is formed in a shape in which a plurality of materials are laminated, and thus the second insulating layer 140 is formed of multiple layers. The second insulating layer 140 includes the lower gate insulation film 142 formed on the semiconductor layer 130, the second light blocking member 144 formed on the lower gate insulation film 142, and the upper gate insulation film 146 formed on the second light blocking member 144.

The second light blocking member 144 may be made of a light blocking material such as silicon germanium (SiGe) or titanium oxide (TiOx).

The lower gate insulation film 142 and the upper gate insulation film 146 may be made of an inorganic insulation material, such as silicon oxide (SiOx), silicon nitride (SiNx).

The process of substantially simultaneously patterning the first insulation material 210 and the second insulation material 220 to form the first insulating layer 120 and the second insulating layer 140 may be simpler than a process of individually forming the first insulating layer 120 and the second insulating layer 140.

Before the process of patterning the first insulation material 210 is completed, an upper surface of the semiconductor layer 130 is covered by the first insulation material 210. Therefore, damage to the upper surface of the semiconductor layer 130 may be minimized. This stands in contrast to the case in which the second insulating layer 140 is formed and the first insulation material 210 is then patterned by a separate process.

To substantially simultaneously form the first insulating layer 120 and the second insulating layer 140, the thickness of the first insulating layer 120 and the thickness of the second insulating layer 140 may be substantially equal to each other.

The lower buffer layer 122 of the first insulating layer 120 may remain on the substrate 110 without being patterned, and therefore, the thickness of the first insulating layer 120 may be greater than or equal to the thickness of the second insulating layer 140. When the first light blocking member 124 of the first insulating layer 120 is not patterned and remains in a pixel area, which displays an image, the first light blocking member 124 may influence the luminance of the display panel. Therefore, the thickness of the upper buffer layer 126 and the first light blocking member 124 may be smaller than or equal to the thickness of the second insulating layer 140.

When the first insulating layer 120 and the second insulating layer 140 are formed by substantially simultaneously patterning the first insulation material 210 and the second insulation material 220, a part of the semiconductor layer 130 is not covered by the second insulating layer 140 and is thus exposed. When the semiconductor layer 130 is made of an oxide semiconductor, the semiconductor layer 130 that does not overlap the second insulating layer 140 may be rendered conductive by performing a plasma process on the exposed part of the semiconductor layer 130 using fluorine or hydrogen gas.

Figure 5:
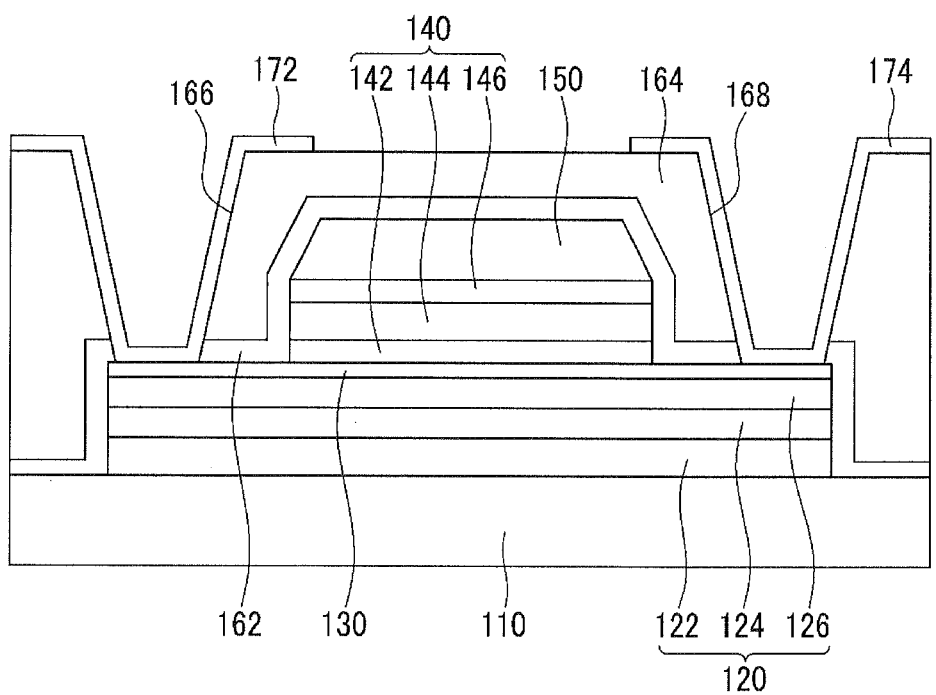

As illustrated in FIG. 5, the passivation films 162 and 164 are formed by removing the second photosensitive film pattern 400 and depositing an insulation material. The passivation films 162 and 164 may include the lower passivation film 162 formed to cover the semiconductor layer 130 and the gate electrode 150, and the upper passivation film 164 formed on the lower passivation film 162. The lower passivation film 162 may be made of an inorganic insulation material, and the upper passivation film 164 may be made of an organic insulation material. Although in FIG. 1, the passivation films 162 and 164 are formed of double layers, the embodiments of the present invention are not limited thereto, and the passivation films 162 and 164 may be formed of a single layer or multiple layers including three or more layers.

The contact holes 166 and 168 are formed by patterning the passivation films 162 and 164, and at least a part of the semiconductor layer 130 is exposed.

The source electrode 172 and the drain electrode 174, which are connected to the semiconductor layer 130 through the contact holes 166 and 168, are formed by depositing and patterning the transparent metal material, such as ITO (Indium Tin Oxide) or IZO (Indium Zinc Oxide) on the passivation films 162 and 164.

Figure 6:
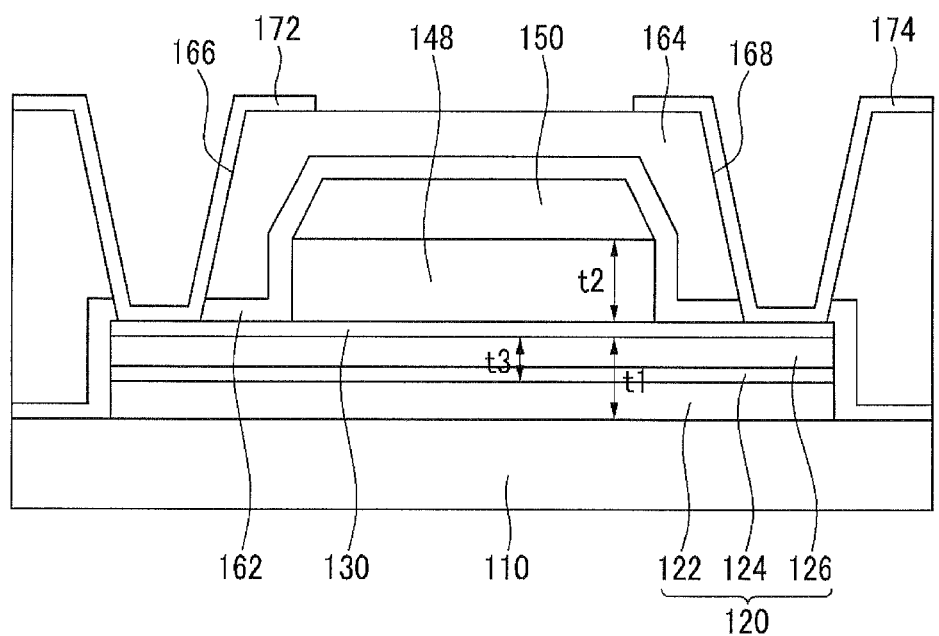
FIG. 6 is a cross-sectional view illustrating a thin film transistor display panel according to an exemplary embodiment of the present invention.

FIG. 6 is a cross-sectional view illustrating a thin film transistor display panel according to an exemplary embodiment of the present invention.

A thin film transistor display panel according to an exemplary embodiment of the present invention includes a substrate 110 made of glass, plastic or the like, a first insulating layer 120 formed on the substrate 110, a semiconductor layer 130 formed on the first insulating layer 120, a second insulating layer 148 formed on the semiconductor layer 130, and a gate electrode 150 formed on the second insulating layer 148.

The first insulating layer 120 includes a lower buffer layer 122 formed on the substrate 110, a first light blocking member 124 formed on the lower buffer layer 122, and an upper buffer layer 126 formed on the first light blocking member 124.

The second insulating layer 148 is formed of a single layer, and thus, a deposition process of the second insulating layer 148 may be relatively simplified.

The second insulating layer 148 may be made of an inorganic insulation material, such as silicon oxide (SiOx) or silicon nitride (SiNx). The second insulating layer 148 does not always include a light blocking material. For example, when the amount of light entering the semiconductor layer 130 is negligible, the second insulating layer 148 does not include a light blocking material.

A thickness t1 of the first insulating layer 120 may be substantially equal to a thickness t2 of the second insulating layer 148. The thickness t1 of the first insulating layer 120 may be greater than or equal to the thickness t2 of the second insulating layer 148, and a thickness t3 of the upper buffer layer 126 and the first light blocking member 124 may be smaller than or equal to the thickness t2 of the second insulating layer 148.

Passivation films 162 and 164 may be further formed on the semiconductor layer 130 and the gate electrode 150, and the passivation films 162 and 164 may include contact holes 166 and 168 through which at least a part of the semiconductor layer 130 is exposed. A source electrode 172 and a drain electrode 174, which are connected to the semiconductor layer 130 through the contact holes 166 and 168, may be formed on the passivation films 162 and 164.

FIGS. 7 to 10 are process cross-sectional views illustrating a method of manufacturing a thin film transistor display panel according to an exemplary embodiment of the present invention.

Figure 7:
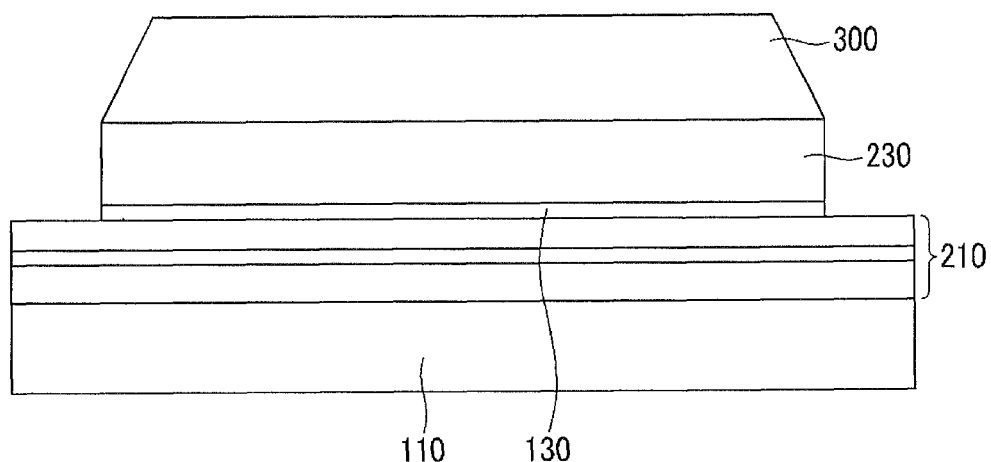
FIGS. 7 to 10 are process cross-sectional views illustrating a method of manufacturing a thin film transistor display panel according to an exemplary embodiment of the present invention.

As illustrated in FIG. 7, the first insulation material 210 is deposited on the substrate 110. The first insulation material 210 includes a light blocking material and may include a plurality of materials.

A semiconductor material is deposited on the first insulation material 210.

A second insulation material 230 is deposited on the semiconductor material. The second insulation material is made of a single material, and may be formed of an inorganic insulation material, such as silicon oxide (SiOx) or silicon nitride (SiNx).

A first photosensitive film pattern 300 is formed on the second insulation material 230, and the second insulation material 230 is patterned by using the first photosensitive film pattern 300. The semiconductor layer 130 is formed by patterning the semiconductor material using the first photosensitive film pattern 300.

Figure 8:
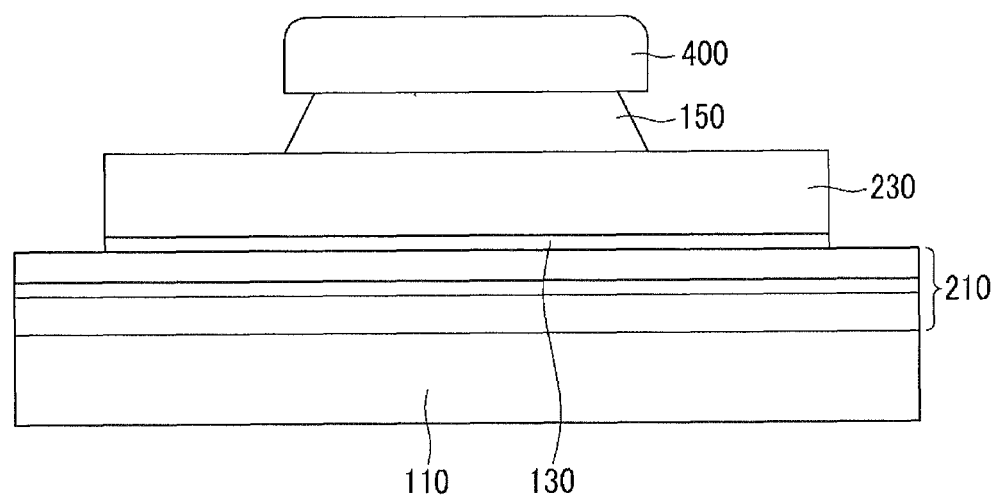

As illustrated in FIG. 8, the first photosensitive film pattern 300 is removed, and a gate metal material is deposited on the second insulation material 230.

A second photosensitive film pattern 400 is formed on the gate metal material, and the gate electrode 150 is formed by patterning the gate metal material by using the second photosensitive film pattern 400.

Figure 9:
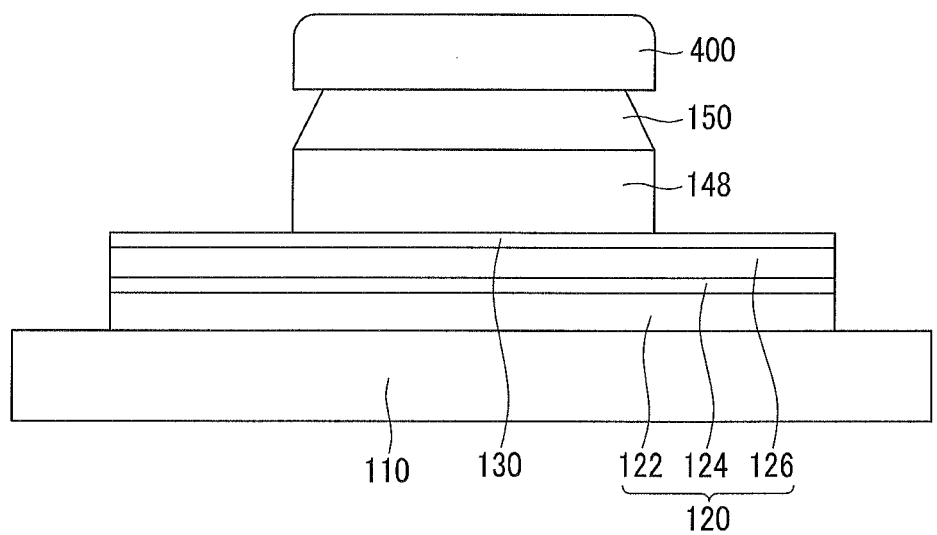

As illustrated in FIG. 9, the first insulating layer 120 and the second insulating layer 148 are formed by substantially simultaneously patterning the first insulation material 210 and the second insulation material 230 using the second photosensitive film pattern 400. The first insulation material 210 that is not covered by the semiconductor layer 130 is removed to thus form the first insulating layer 120, and the second insulation material 230 that is not covered by the second photosensitive film pattern 400 is removed to thus form the second insulating layer 148.

The first insulation material 210 is formed in a shape in which a plurality of materials are laminated, and thus the first insulating layer 120 includes multiple layers. The first insulating layer 120 includes a lower buffer layer 122 formed on the substrate 110, a first light blocking member 124 formed on the lower buffer layer 122, and an upper buffer layer 126 formed on the first light blocking member 124.

The second insulation material 230 is made of a single material, and thus the second insulating layer 148 is formed of a single layer. The second insulating layer 148 may be made of an inorganic insulation material, such as silicone oxide (SiOx) or silicon nitride (SiNx).

The first insulating layer 120 and the second insulating layer 148 are formed by substantially simultaneously patterning the first insulation material 210 and the second insulation material 230. Accordingly, a process may be simplified, and damage to an upper surface of the semiconductor layer 130 may be minimized. The semiconductor layer 130 that is not covered by the second insulating layer 148 may undergo a plasma process and may be thus rendered conductive.

Figure 10:
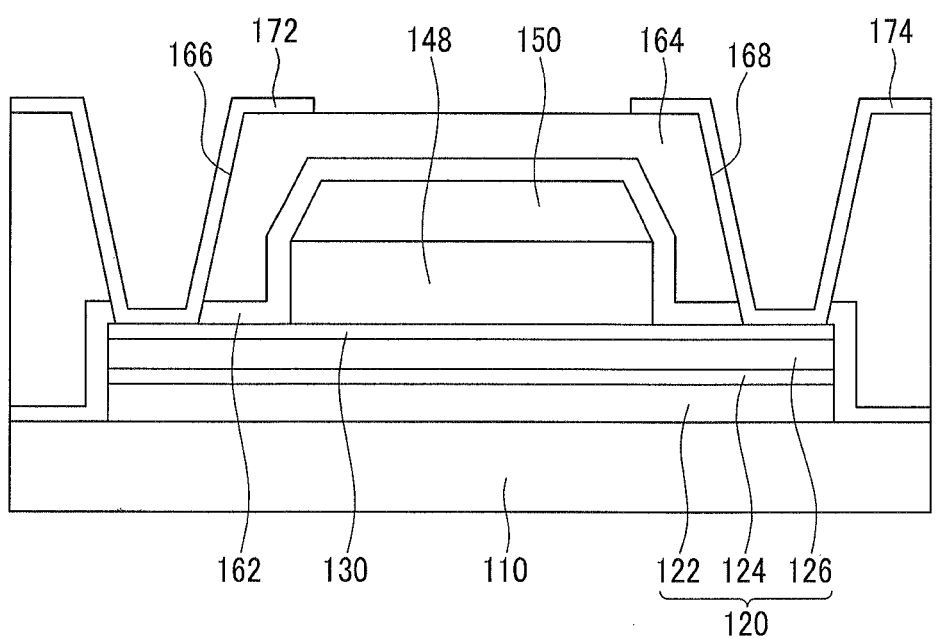

As illustrated in FIG. 10, the second photosensitive film pattern 400 is removed, and the passivation films 162 and 164 are formed by depositing an insulation material on the semiconductor layer 130, the second insulating layer 148, and the gate electrode 150.

The contact holes 166 and 168 are formed by patterning the passivation films 162 and 164, and thus, at least a part of the semiconductor layer 130 is exposed, and the source electrode 172 and the drain electrode 174 which are connected to the semiconductor layer 130 through the contact holes 166 and 168 are formed on the passivation films 162 and 164.

While embodiments of this invention have been described, it is to be understood that the invention is not limited to the embodiments, but, on the contrary, is intended to cover various modifications and equivalent arrangements.

What is claimed is:

1. A method of manufacturing a thin film transistor display panel, comprising:
    depositing a first insulation material including a light blocking material on a substrate;
    depositing a semiconductor material on the first insulation material;
    depositing a second insulation mate al on the semiconductor material;
    forming a first photosensitive film pattern on the second insulation material;
    patterning the second insulation material using the first photosensitive film pattern;
    forming a semiconductor layer by patterning the semiconductor material using the first photosensitive film pattern;
    removing the first photosensitive film pattern;
    depositing a gate metal material on the second insulation material;
    forming a second photosensitive film pattern on the gate metal material;
    forming a gate electrode by patterning the gate metal material using the second photosensitive film pattern; and
    forming a first insulating layer and a second insulating layer by substantially simultaneously patterning the first insulation material and the second insulation material using the second photosensitive film pattern.

2. The method of manufacturing a thin film transistor display panel of claim 1, wherein the first insulating layer comprises:
    a lower buffer layer;
    a first light blocking member formed on the lower buffer layer; and
    an upper buffer layer formed on the first light Hocking member.

3. The method of manufacturing a thin film transistor display panel of claim 2, wherein the first insulating layer is formed by removing the first insulation material that is not covered by the semiconductor layer, and the second insulating layer is formed by removing the second insulation material that is not covered by the second photosensitive film pattern.

4. The method of manufacturing a thin film transistor display panel of claim 2, wherein at least a part of the lower buffer layer covers the semiconductor layer.

5. The method of manufacturing a thin film transistor display panel of claim 2, wherein the first insulation material and the semiconductor layer have different etching rates.

6. The method of manufacturing a thin film transistor display panel of claim 5, wherein the lower buffer layer and the upper buffer layer are made of silicon oxide or silicon nitride, and the first light blocking member is made of silicon germanium or titanium oxide.

7. The method of manufacturing a thin film transistor display panel of claim 2, wherein the second insulating layer comprises:
    a lower gate insulation film;
    a second light blocking member formed on the lower gate insulation film; and
    an upper gate insulation film formed on the second light blocking member.

8. The method of manufacturing a thin film transistor display panel of claim 7, wherein the lower gate insulation film and the upper gate insulation film are made of silicon oxide or silicon nitride, and the second light blocking member is made of silicon germanium or titanium oxide.

9. The method of manufacturing a thin film transistor display panel of claim 2, wherein the second insulating layer is formed of a single layer.

10. The method of manufacturing a thin film transistor display panel of claim 1, further comprising:
    removing the second photosensitive film pattern;
    forming a passivation film on the semiconductor layer and the gate electrode;
    forming a contact hole by patterning the passivation film, wherein at least a part of the semiconductor layer is exposed through the contact hole; and
    forming a source electrode and a drain electrode, which are connected to the semiconductor layer through the contact hole, on the passivation film.

11. A method of manufacturing a thin film transistor, the method comprising:
    depositing a first insulating material on a substrate;
    depositing a semiconductor material on the first insulating material;
    depositing a second insulating material on the semiconductor material;
    depositing a gate metal material on the second insulating material;
    forming a second photosensitive film pattern on the gate metal material; and
    forming a first insulating layer and a second insulating layer by substantially simultaneously patterning the first and second insulating materials using the second photosensitive film pattern, wherein the first insulating layer includes a light blocking member, wherein the semiconductor material is disposed between the first insulating material and the second insulating material.

* * * * *